United States Patent [19]

Driver et al.

[11] 4,077,111
[45] Mar. 7, 1978

[54] SELF-ALIGNED GATE FIELD EFFECT TRANSISTOR AND METHOD FOR MAKING SAME

[75] Inventors: Michael C. Driver, Penn Hills; He B. Kim, Murrysville, both of Pa.

[73] Assignee: Westinghouse Electric Corporation, Pittsburgh, Pa.

[21] Appl. No.: 705,322

[22] Filed: Jul. 14, 1976

[51] Int. Cl.² ............................................. B01J 17/00
[52] U.S. Cl. .................................... 29/571; 29/579; 29/580; 357/15; 357/22
[58] Field of Search ................. 29/571, 578, 579, 580; 357/15, 22

[56] References Cited

U.S. PATENT DOCUMENTS

| | | | |
|---|---|---|---|
| 3,855,690 | 12/1974 | Kim | 357/15 |
| 3,861,024 | 1/1975 | Napoli | 29/579 |
| 3,866,310 | 2/1975 | Driver | 29/579 |
| 3,906,541 | 9/1975 | Goronkin | 357/15 |
| 4,040,168 | 8/1977 | Huang | 29/571 |

Primary Examiner—W. Tupman
Attorney, Agent, or Firm—C. L. Menzemer

[57] ABSTRACT

A self-aligned gate field effect transistor is described which is capable of operating at high frequencies. A method for making the transistor is described which comprises plating metal partially over an oxide layer, then removing the oxide to produce an overlapping metal portion and then plating again to produce a gate contact between the overlapping metal portions.

4 Claims, 8 Drawing Figures

SELF-ALIGNED GATE FIELD EFFECT TRANSISTOR AND METHOD FOR MAKING SAME

BACKGROUND OF THE INVENTION

1. Field of the Invention:

The invention pertains to high frequency field effect transistors and particularly GaAs self-aligned gate field transistors.

2. Description of the Prior Art:

A device of the prior art, which may be produced by known techniques, is illustrated in FIG. 1. The prior art device 10 comprises a GaAs substrate 12, an N-type GaAs region 14 disposed on surface 13 of the substrate 12, and a gate electrode 30 disposed on surface 15 of region 14 between source electrode 22 and drain electrode 24 as shown. Gate electrode 30 is produced by a known metallization process. The metallization of gate electrode 30 also results in the deposition of additional metal layers 26 and 28, which are disposed on electrodes 22 and 24 respectively.

It has been found that a relatively high contact resistance exists between the electrodes 22 and 24 and region 14. It is desirable to have relatively low contact resistance in order to achieve a higher gain and a correspondingly higher cut-off frequency and higher power output capability. The present invention achieves this purpose and provides other advantages which will be apparant to those skilled in the art from the description of the invention which follows.

SUMMARY OF THE INVENTION

The invention is a self-aligned gate field effect transistor comprising a semi-insulating GaAs substrate, an N-type channel region disposed on said substrate, an N$^+$-type source region disposed on said substrate and adjoining a first side of said channel region, an N$^+$-type drain region disposed on said substrate and adjoining a second side of said channel region, a source electrode disposed on said source region and overhanging said channel region, a drain electrode disposed on said drain region and overhanging said channel region, said source and drain electrodes forming a window over said channel region, and a gate electrode disposed on said channel region in juxtaposition under said window.

DESCRIPTION OF THE PREFERRED EMBODIMENT

Figure 1:
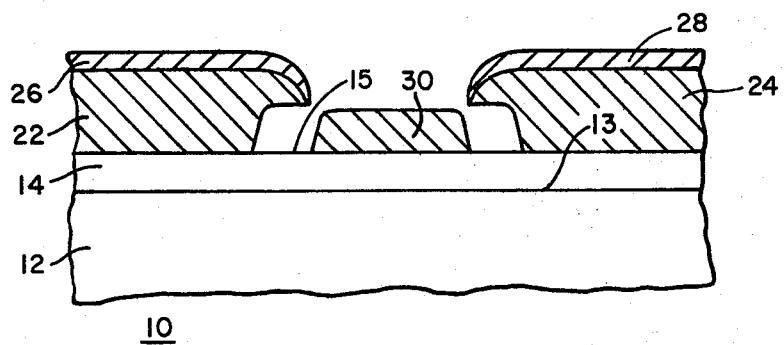
FIG. 1 is a vertical cross-sectional view of a device of the prior art.
Figure 2:
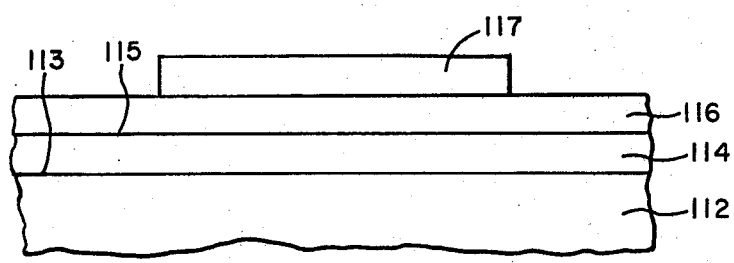
FIGS. 2 through 8 are vertical cross-sectional views illustrating a sequence of steps for producing a device of the present invention.

FIG. 2 illustrates a GaAs substrate 112 which is essentially free of carriers or "semi-insulating". The term "semi-insulating" in this specification will be understood to means a resistivity greater than $10^6$ ohm-cm. An N-type GaAs region 114 is disposed on surface 113 of the substrate 112 by a known vapor phase or liquid phase epitaxial process. A layer 116 or SiO$_2$ is disposed on top surface 115 of the region 114 by known vacuum evaporation, vacuum sputtering or a chemical vapor deposition technique. The SiO$_2$ layer 116 is preferably about 1 micron thick. A pattern of photoresist material 117 is disposed on a portion of SiO$_2$ layer 116 in a known manner.

Figure 3:
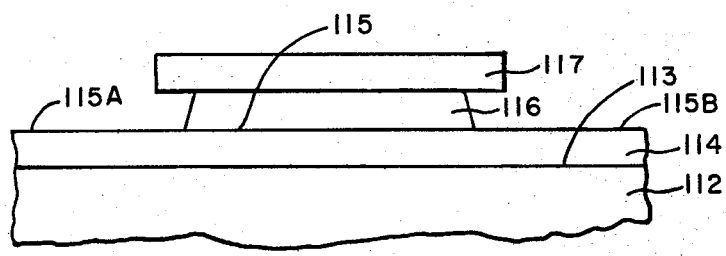
Figure 4:
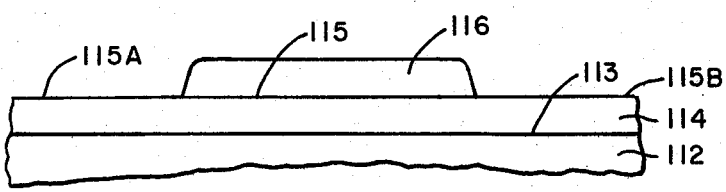

FIG. 3 illustrates the device after portions of the SiO$_2$ layer 116 have been etched in a known manner thereby exposing surface portions 115A and 115N of N-type GaAs region 114. The photoresist material 117 is then removed by known techniques which produces the structure of FIG. 4.

Figure 5:
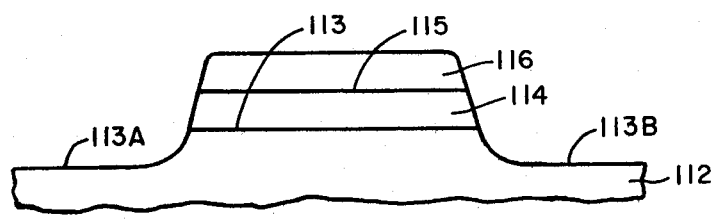

Region 114 is then selectively etched away at surfaces 115A and 115B thereby exposing surface portions 113A and 113B of the substrate 112 as shown in FIG. 5. Region 114 is preferably etched with H$_2$SO$_4$:H$_2$O:H$_2$O$_2$ in the ratio 50:1.2.

Figure 6:
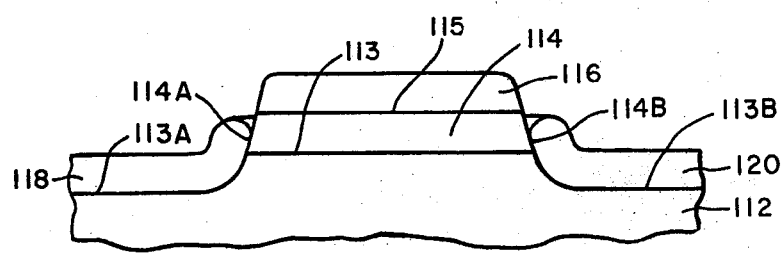

Regions 118 and 120 of N+type GaAs are then epitaxially grown on surface portions 113A and 113B of the substrate 112, as well as on edges 114A and 114B of N-type region 114 as shown in FIG. 6 using a known vapor phase epitaxial process.

Figure 7:
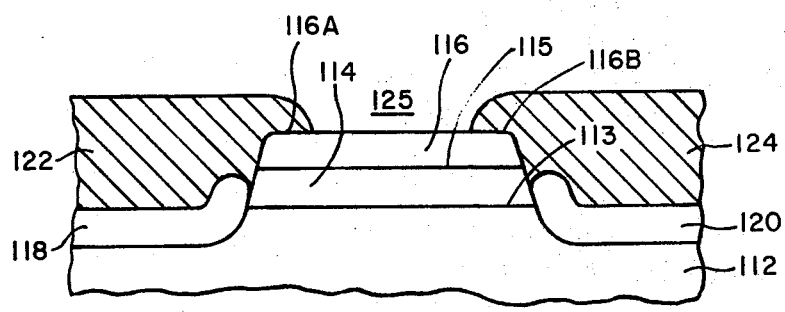

A gold plating step is then performed in a known manner to produce electrodes 22 and 24 shown in FIG. 7. For example, suitable gold plating techniques are described in U.S. Pat. Nos. 3,675,313 and 3,678,573, which are assigned to the same assignee as the present invention. Gold electrodes 122 and 124 are disposed upon N+type GaAs layers 118 and 120 respectively. The gold electrodes 122 and 124 also overlap portions 116A and 116B of the SiO$_2$ layer 116 as shown providing a window 125 therebetween.

Figure 8:
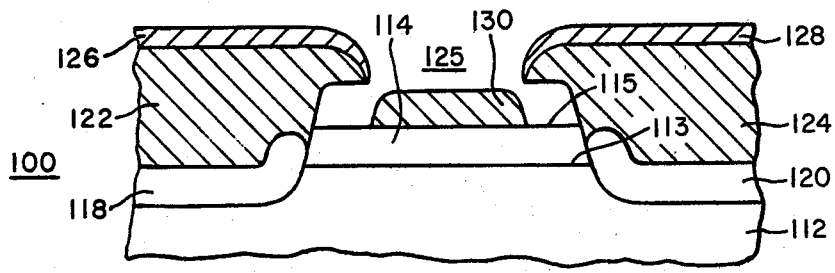

FIG. 8 depicts a device 100 of the present invention, which is achieved by first removing the SiO$_2$ layer 116 of FIG. 7 leaving gold electrodes 122 and 124 overhanging N-type region 114. A final gold evaporation step produces electrode layers 126, 128 and 130 as shown. Gold layer 130 provides the gate electrode to N-type region 114, while layers 126 and 128 provide source and drain electrodes through the gold layers 122 and 124 to source region 118 and drain region 120.

The amount of overhang of electrodes 122 and 124 depends on the desired channel length of region 114, which is limited by only the practical consideration of preventing shorting between electrode 130 and the adjacent electrodes 122 and 124. When the final gold evaporation step is performed, gate electrode 130 automatically aligns itself on surface 115 of channel region 114 in juxtaposition under window 125.

The contact resistance of device 100 is lower than that of device 10 for two reasons. First, electrons more readily enter source region 118 from electrode 122 by the well known mechanism of tunneling since the barrier due to the work function difference between the metal electrode 122 and GaAs region 118 of device 100 is much narrower than the barrier between the metal electrode 22 and GaAs region 14 of device 10. Secondly, N+-type regions 118 and 120 of device 100 have a lower bulk resistance than N-type region 14 of device 10. Both of the above effects are due to the higher impurity level in regions 118 and 120 relative to region 14.

Since device 100 has a lower contact resistance than prior art device 10, the present invention achieves the desired improvements in characteristics such as gain, cut-off frequency and power output.

Those skilled in the art will appreciate these and other advantages of the present invention over prior art field effect transistors.

We claim:

1. A method of making a self-aligned gate field effect transistor comprising the steps:

a. forming an N-type GaAs channel region on a semi-insulating GaAs substrate, b. forming a layer of SiO$_2$ masking a portion of the channel region,
c. etching through unmasked portions of the channel region to expose portions of the substrate,
d. epitaxially growing N$^+$-type source and drain regions on the exposed portions of the substrate,
e. depositing source and drain electrodes on the source and drain regions and partially overlapping the SiO$_2$ layer,
f. removing the SiO$_2$ layer, and
g. depositing a gate electrode on the channel region while using said partially overlapping portions of the source and drain electrodes as masks to space the gate electrodes from each of the source and drain electrodes.

2. The method of claim 1 wherein in step (b) the SiO$_2$ layer is about one micron thick.

3. The method of claim 1 wherein in step (c) the channel region is etched with H$_2$SO$_4$:H$_2$O:H$_2$O$_2$ in the ration 50:1:2.

4. The method of claim 1 wherein in step (d) the source and drain regions are additionally grown on edges of the channel region.

* * * * *